(12) United States Patent
Lee

(10) Patent No.: US 6,296,988 B1
(45) Date of Patent: Oct. 2, 2001

(54) METHOD FOR FORMING A MENTAL WIRING PATTERN ON A SEMICONDUCTOR DEVICE

(75) Inventor: Bok-Hyung Lee, Kyungki-do (KR)

(73) Assignees: ANAM Semiconductor, Inc. (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/262,789

(22) Filed: Mar. 4, 1999

(30) Foreign Application Priority Data

Mar. 4, 1998 (KR) .................................................. 98-7060

(51) Int. Cl.$^7$ ...................................................... G03C 5/00
(52) U.S. Cl. ........................... 430/318; 430/313; 430/314
(58) Field of Search ..................................... 430/313, 318, 430/329, 314; 216/58, 67, 41; 438/706, 745

(56) References Cited

U.S. PATENT DOCUMENTS

| | | | | |
|---|---|---|---|---|
| 6,015,761 | * | 1/2000 | Merry et al. | 438/727 |
| 6,027,861 | * | 2/2000 | Yu et al. | 430/316 |
| 6,032,682 | * | 3/2000 | Verhaverbeke | 134/1.3 |

* cited by examiner

Primary Examiner—Mark F. Huff
Assistant Examiner—Saleha R. Mohamedulla

(57) ABSTRACT

A method for forming a metal wiring pattern of a semiconductor device. A metal film is first deposited on a semiconductor substrate, then a photoresist pattern is formed on the metal film. The metal film is etched using the photoresist pattern as a mask, then a portion of the photoresist pattern is removed through an under-ashing process. Thereby, the photoresist pattern does not harden and is readily removable. Next, polymer impurity layer formed during the etching act is removed through a chemical wet cleaning process.

30 Claims, 3 Drawing Sheets

METHOD FOR FORMING A MENTAL WIRING PATTERN ON A SEMICONDUCTOR DEVICE

BACKGROUND

1. Field of the Invention

The present invention relates to a method for making a semiconductor device, and more particularly, to a method for forming a metal pattern for a wiring of a semiconductor device.

2. Description of the Related Art

FIGS. 1A through 1E illustrate, in cross-section, a portion of a semiconductor device as it undergoes conventional processing acts in sequence for forming a metal pattern for a wiring of a semiconductor device.

Referring first to FIG. 1A, a first refractory metal film 2, a metal wiring film 3, and a second refractory metal film 4 are, in this order, deposited on a semiconductor substrate 1. A photoresist film 5 is then deposited on the second refractory metal film 4.

Next, as shown in FIG. 1B, a photoresist pattern 5' is formed by etching the photoresist film 5 through a photolithography process.

Next, the metal films 2, 3 and 4 are etched using the photoresist pattern 5' as a mask, thereby obtaining metal patterns 2', 3' and 4' as shown in FIG. 1C. At this point, the etching process is performed by a dry-etching method using a gas mixture such as $BCl_3/Cl_2/N_2$. During this process, polymer impurity layer 6 is created on an upper surface of the photoresist pattern 5' as well as on side walls of the metal patterns 2', 3' and 4'; (see FIG. 1C). Furthermore, part of the metal wiring pattern 3' is corroded by reacting with the $Cl_2$ of the gas mixture of $BCl_3/Cl_2/N_2$.

Next, to remove the photoresist pattern 5' and part of the polymer impurity layer 6, the substrate 1 is heat-treated within an ashing chamber at a temperature of about 150–250° C. However, since the polymer impurity layer 6 encloses most of the photoresist pattern 5', the photoresist pattern 5' is not completely removed as shown in FIG. 1D. At this point, the remaining photoresist pattern 5' becomes hardened by the relatively high temperature of about 150–250° C. used in the ashing process.

Following the above, the polymer impurity layer 6 is removed by a chemical wet-cleaning process. However, at this point, since it is impossible to remove the remaining photoresist pattern 5' as a result of the hardening of the same during the ashing process, as shown in FIG. 1E, the remaining photoresist pattern 5' is left on the metal pattern 4' even after the chemical wet-cleaning process. This remaining photoresist pattern 5' makes it difficult to carry out a subsequent metal layer formation process.

SUMMARY

An embodiment of the present invention provides a method for forming a metal wiring pattern of a semiconductor device, including the acts of: forming a metal film on a semiconductor substrate; forming a photoresist pattern on the metal film; removing a portion of the metal film, where the mask defines the removed portion; and removing a portion of the photoresist pattern using an under-ashing process. In an embodiment, the under-ashing process is conducted at a temperature of approximately 40–50° C. so as to prevent the remaining photoresist pattern from hardening.

BRIEF DESCRIPTION OF THE DRAWINGS

The accompanying drawings, which are incorporated in and constitute a part of the specification, illustrate an embodiment of the present invention, and, together with the description, serve to explain the principles of the invention.

DETAILED DESCRIPTION

This application is substantially similar to Korean Patent Application No. 98-7060 filed on Mar. 4, 1998, the disclosure of which is incorporated herein by reference.

Reference will now be made in detail to an embodiment of the invention, an example of which is illustrated in the accompanying FIGS. 2A–2F. The same reference numbers are used throughout the drawings to refer to the same or like parts.

FIGS. 2A through 2F illustrate, in cross-section, a portion of a semiconductor device as it undergoes sequential processing acts in accordance with an embodiment of the present invention.

Figure 1A:
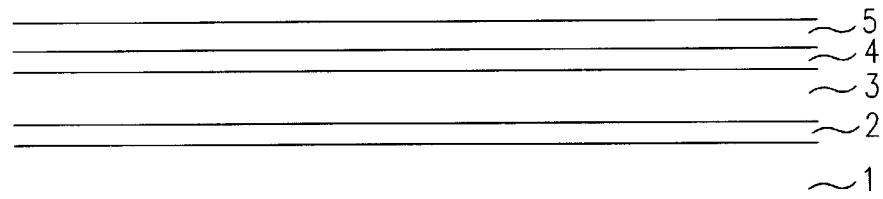
FIGS. 1A through 1E illustrate, in cross-section, a portion of a semiconductor device as it undergoes conventional processing acts in sequence for forming a metal pattern for a wiring of a semiconductor device.
Figure 1B:
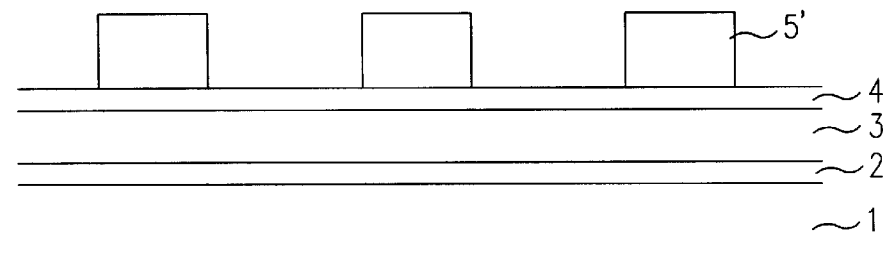
Figure 1C:
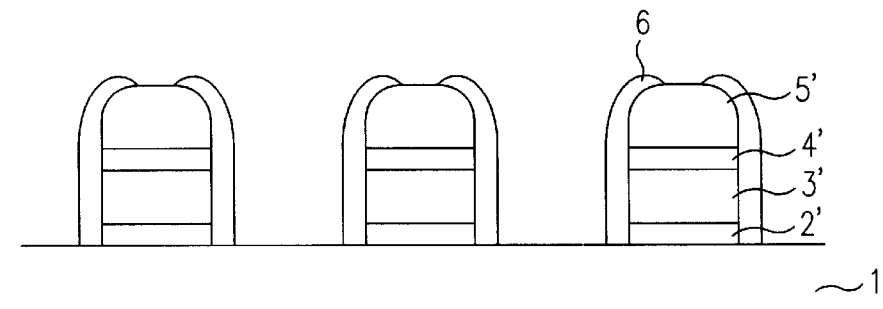
Figure 1D:
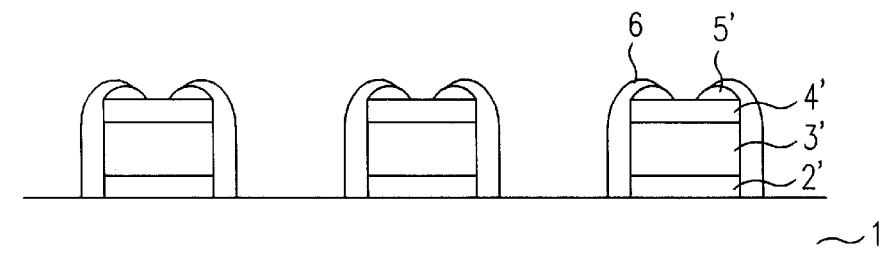
Figure 1E:
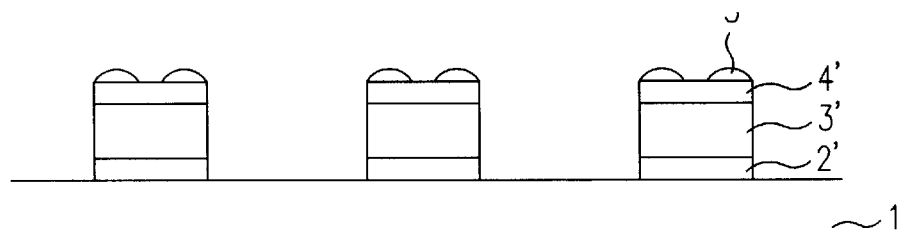
Figure 2A:
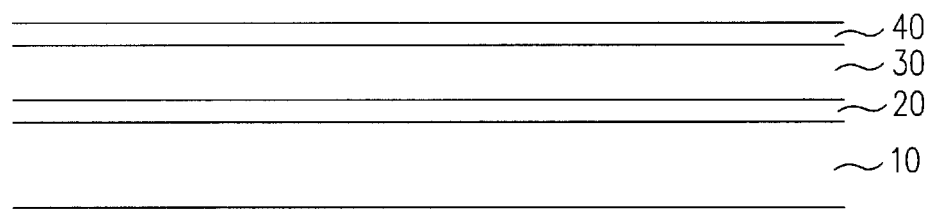
FIGS. 2A through 2F illustrate, in cross-section, a process for forming a portion of a semiconductor device in accordance with an embodiment of the present invention.

Referring first to FIG. 2A, deposited on an insulating substrate 10, which may be part of a semiconductor substrate, are, in order, a first refractory metal film 20, a metal wiring film 30 made of, e.g., aluminum or aluminum alloy, and a second refractory metal film 40.

Figure 2B:
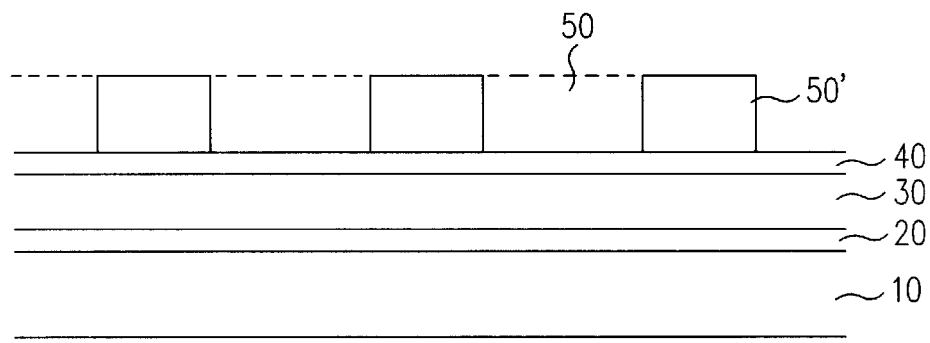

Next, as shown in FIG. 2B, a photoresist film 50 is deposited on the second refractory metal film 40, then a photoresist pattern 50' is formed by, e.g., etching the photoresist film 50 using a photolithography process.

Figure 2C:
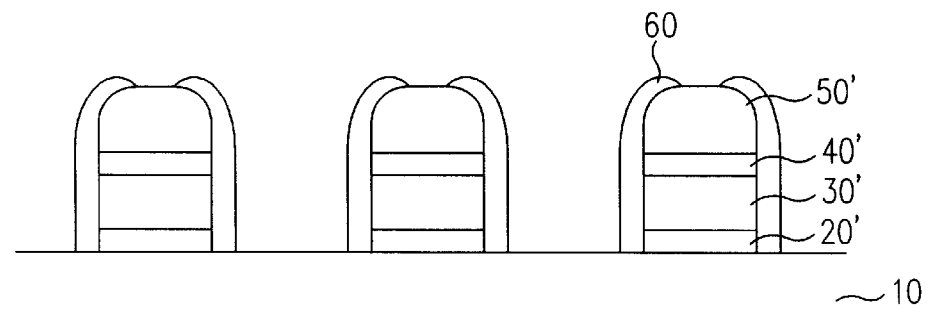

Next, the metal films 20, 30 and 40 are shaped by, e.g., etching within a processing chamber using the photoresist pattern 50' as a mask, thereby forming metal patterns 20', 30' and 40' as shown in FIG. 2C. A suitable etch technique is to apply a gas mixture of $BCl_3/Cl_2/N_2$ as an etching gas and hydrogen $H_2$ as a cooling gas. A suitable pressure within the processing chamber is approximately 5–12 mT and a suitable process temperature is approximately 35–60° C. Consequently, a polymer impurity layer 60 is created on an upper surface of the photoresist pattern 50' as well as side walls of the metal patterns 20', 30' and 40' (see FIG. 2C). In addition, a portion of the metal wiring film 30 containing aluminum components reacts with the etching gas, thereby corroding and changing into $Al_2Cl_3$.

Figure 2D:
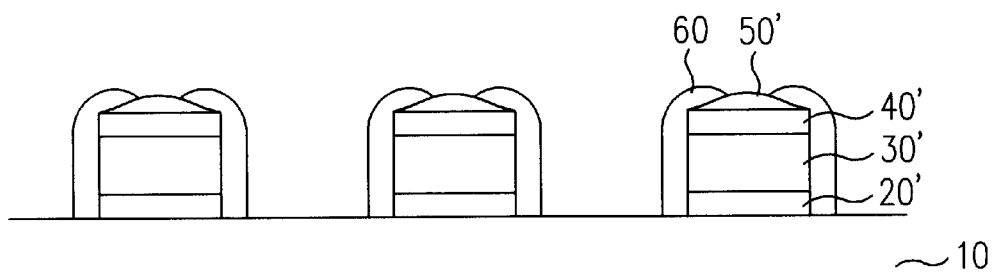

Next, within the same chamber, a portion of the photoresist pattern 50' is removed by, e.g., using an in-line under-ashing process using an $O_2$ or $O_2/CF_4$ gas having a flow rate of about 200–500 sccm, thereby reducing a thickness of the photoresist pattern 50' as shown in FIG. 2D. The pressure within the chamber is set to approximately 50–100 mT and a process temperature is set to approximately 40–50° C. thereby avoiding the photoresist pattern 50' from hardening. A suitable ashing time is less than 20 seconds, and a suitable ashing rate is about 3,000–5,000 Å/min. In addition, when the $O_2/CF_4$ gas is used as the process gas, the percentage of $CF_4$ is preferably about 5–15%. Since the ashing process is consecutively conducted within the same chamber following the etching act, a portion adjacent to the corroded portion of the aluminum film 30 is prevented from being corroded.

Figure 2E:
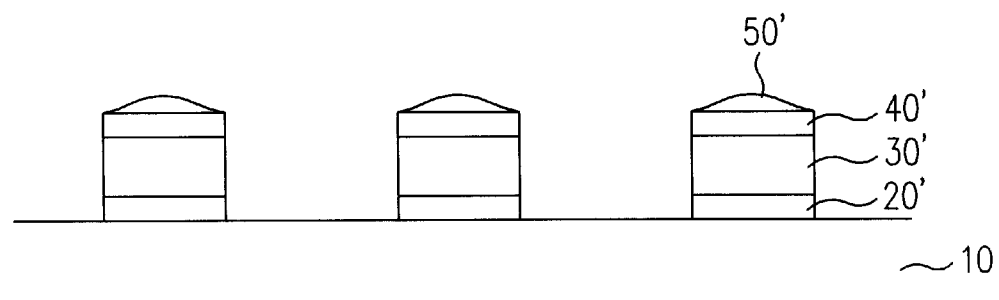
Figure 2F:
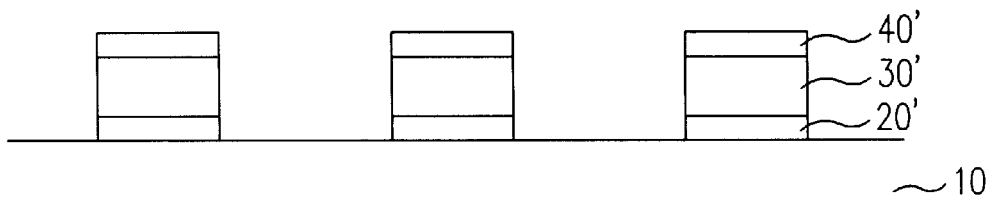

Following the above, as shown in FIG. 2E, the polymer impurity layer 60 is removed using, e.g., a chemical wet-cleaning process using either a chemical agent such as a $H_2SO_4/H_2O_2$ (4/1 volume ratio) solution or a developer such as photo track.

Finally, the photoresist pattern 50' remaining on the metal pattern 40' is removed using, e.g., an ashing process conducted in a different ashing chamber (hereafter "different chamber"). A suitable ashing process includes using an $O_2/H_2-N_2$ gas mixture, where the $O_2$ can range from 3 to 97 percent of the gas mixture, having a flow rate of approximately 2300 sccm. A suitable pressure and temperature within the different chamber are respectively approximately 1.5 T and approximately 250° C. (+/−50° C.) and a suitable duration of the gas mixture exposure is approximately 70 seconds.

The above described method can be applied to remove a polymer impurity layer created when forming an oxide pattern, an insulating pattern, or a polysilicon pattern.

The above-described embodiments are illustrative and not limiting. It will thus be obvious to those skilled in the art that various changes and modifications may be made without departing from this invention in its broader aspects. Therefore, the appended claims encompass all such changes and modifications as fall within the scope of this invention.

What is claimed is:

1. A method for forming a metal wiring pattern of a semiconductor device, comprising the acts of:
   forming a metal film on a semiconductor substrate;
   forming a photoresist pattern on the metal film;
   removing a portion of the metal film, wherein the photoresist pattern defines the removed portion and a polymer impurity layer is formed on the photoresist pattern;
   removing a portion of the photoresist pattern using an under-ashing process; and
   removing the polymer impurity layer.

2. The method of claim 1 wherein the act of removing the polymer impurity layer uses a chemical wet cleaning process.

3. The method of claim 1 wherein the under-ashing process is conducted at a temperature of approximately 40–50° C. so as to prevent the remaining photoresist pattern from being hardened.

4. The method of claim 1 wherein the under-ashing process is conducted using $O_2$ or $O_2/CF_4$ gas.

5. The method of claim 4 wherein a gas flow rate of the $O_2$ or $O_2/CF_4$ is approximately 200–500 sccm.

6. The method of claim 1 wherein the under ashing process is conducted at a pressure of approximately 50–100 mT.

7. The method of claim 1 wherein the under-ashing process is conducted for about 20 seconds with an ashing rate of approximately 3,000–5,000 Å/min.

8. The method of claim 4 wherein a percentage of $CF_4$ of the $O_2/CF_4$ gas is approximately 5–15%.

9. The method of claim 2 wherein the chemical wet cleaning process comprises applying a H2SO4/H2O2 solution.

10. The method of claim 2 further comprising the act of removing a remaining photoresist pattern using an ashing process after the act of removing the polymer impurity layer.

11. The method of claim 1 wherein the act of forming the metal film comprises:
    forming a first refractory metal film;
    forming a metal wiring film; and
    forming a second refractory metal film.

12. The method of claim 11 wherein the metal wiring film comprises a material selected from the group consisting of aluminum and an aluminum alloy.

13. The method of claim 1 wherein the act of removing a portion of the metal film comprises applying a gas mixture of $BCl_3/Cl_2/N_2$.

14. The method of claim 1 wherein the act of removing a portion of the metal film and the act of removing a portion of the photoresist pattern are consecutively conducted in a same chamber.

15. A method for forming a metal wiring pattern of a semiconductor device, comprising the acts of:
    forming a metal film on a semiconductor substrate;
    forming a photoresist mask on the metal film;
    etching the metal film through the photoresist mask so as to form an etched metal wire having sidewalls and an upper surface, wherein a residual portion of the photoresist mask remains on the upper surface of the etched metal wire after said etching and a polymer impurity layer forms on the photoresist mask and on the sidewalls of the etched metal wire during said etching; and
    removing a portion of the residual photoresist mask on the upper surface of the etched metal wire using an under-ashing process.

16. The method of claim 15, further comprising removing the polymer impurity layer using a chemical wet cleaning process after the under-etching process.

17. The method of claim 15, wherein the under-ashing process is conducted at a temperature of approximately 40–50° C.

18. The method of claim 15, wherein the under-ashing process is conducted at a temperature less than approximately 50° C.

19. The method of claim 15, wherein the under-ashing process is conducted using O2 or O2/CF4 gas.

20. The method of claim 19, wherein a gas flow rate of the O2 or O2/CF4 is approximately 200–500 sccm.

21. The method of claim 15, wherein the under-ashing process is conducted at a pressure of approximately 50–100 mT.

22. The method of claim 15 wherein the under-ashing process is conducted at a temperature of approximately 40–50° C. and a pressure of approximately 50–100 mT using a process gas that at least includes oxygen.

23. The method of claim 16, further comprising ashing the substrate to expose the upper surface of the metal wire after the act of removing the polymer impurity layer.

24. The method of claim 15, wherein etching the metal film and under-ashing are consecutively conducted in a same chamber.

25. The method of claim 17, wherein etching the metal film and under-ashing are consecutively conducted in a same chamber.

26. The method of claim 18, wherein etching the metal film and under-ashing are consecutively conducted in a same chamber.

27. The method of claim 22, wherein etching the metal film and under-ashing are consecutively conducted in a same chamber.

28. A method of patterning a metal layer on a semiconductor wafer, the method comprising:
    etching the metal layer in a first chamber through a photoresist mask so as to form a metal wire,
        wherein said etched wire has sidewalls, and an upper surface covered by a portion the photoresist mask, and
        wherein during said etching a polymer impurity layer forms over the sidewalls of the etched wire and on the photoresist mask;

removing a portion of the photoresist mask that is on the upper surface of the etched wire using a process in said first chamber conducted at less than approximately 50° C.; and removing the semiconductor wafer from the first chamber, and subsequently removing the polymer impurity layer and all of a remaining portion of the photoresist mask from the upper surface of the metal wire.

29. The method of claim 28, wherein the polymer impurity layer is removed using a chemical wet cleaning process, and all of the remaining portion of the photoresist mask is subsequently removed from the upper surface of the metal wire using an ashing process in a second chamber.

30. The method of claim 28, wherein the process is conducted at a temperature of approximately 40–50° C.

* * * * *